(12) United States Patent
Zhang et al.

(10) Patent No.: US 10,673,007 B2
(45) Date of Patent: Jun. 2, 2020

(54) OLED DEVICE AND METHOD FOR MANUFACTURING THE SAME, OLED DISPLAY PANEL AND DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xiaojin Zhang, Beijing (CN); Lei Chen, Beijing (CN); Dini Xie, Beijing (CN); Dan Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 16/054,550

(22) Filed: Aug. 3, 2018

(65) Prior Publication Data
US 2019/0131561 A1 May 2, 2019

(30) Foreign Application Priority Data
Oct. 31, 2017 (CN) .......................... 2017 1 1044294

(51) Int. Cl.
*H01L 51/52* (2006.01)
*H01L 27/32* (2006.01)
(Continued)

(52) U.S. Cl.
CPC ........ *H01L 51/5203* (2013.01); *G02B 5/3025* (2013.01); *H01L 27/32* (2013.01);
(Continued)

(58) Field of Classification Search
None
See application file for complete search history.

(56) References Cited

U.S. PATENT DOCUMENTS 5,663,573 A * 9/1997 Epstein ............... H01L 51/5012
257/103
5,858,561 A * 1/1999 Epstein .................. H01L 51/50
257/79
(Continued)

FOREIGN PATENT DOCUMENTS

CN 102443858 A 5/2012
CN 102749778 A 10/2012
(Continued)

OTHER PUBLICATIONS

First Office Action dated Oct. 9, 2018 corresponding to Chinese application No. 201711044294.8.

*Primary Examiner* — Dung A. Le
(74) *Attorney, Agent, or Firm* — Nath, Goldberg & Meyer; Joshua B. Goldberg

(57) ABSTRACT

The present disclosure provides an organic light emitting diode (OLED) device and a method for manufacturing the same, an OLED display substrate and an OLED display device. The OLED device of the present disclosure comprises a substrate, and a first electrode, a light emitting layer and a second electrode arranged on the substrate, wherein the light emitting layer comprises fibers of p-phenylene based polymer as a host material, and the fibers of p-phenylene based polymer are arranged in a first orientation; and wherein the light emitted by the fibers of p-phenylene based polymer arranged in the first orientation is linearly polarized light in a first direction. The OLED device of the present disclosure can simultaneously ensure a good contrast, brightness and light transmittance.

12 Claims, 3 Drawing Sheets

(51) Int. Cl.
*G02B 5/30* (2006.01)
*H01L 51/56* (2006.01)
*H01L 51/00* (2006.01)

(52) U.S. Cl.
CPC ...... *H01L 51/0012* (2013.01); *H01L 51/0038* (2013.01); *H01L 51/5237* (2013.01); *H01L 51/5281* (2013.01); *H01L 51/5293* (2013.01); *H01L 51/56* (2013.01)

(56) References Cited

U.S. PATENT DOCUMENTS

| | | | |
|---|---|---|---|
| 2002/0109458 A1* | 8/2002 | Pichler | H01L 51/5203 313/504 |
| 2003/0081315 A1 | 5/2003 | Kobayashi | |
| 2005/0035361 A1 | 2/2005 | Peterson et al. | |
| 2016/0369057 A1* | 12/2016 | Shaligram | C08G 73/18 |

FOREIGN PATENT DOCUMENTS

| | | |
|---|---|---|
| CN | 202972780 U | 6/2013 |
| CN | 103345071 A | 10/2013 |

\* cited by examiner

Light transmission mode        Cross extinction mode

OLED DEVICE AND METHOD FOR MANUFACTURING THE SAME, OLED DISPLAY PANEL AND DEVICE

CROSS-REFERENCE OF RELATED APPLICATIONS

The present application claims the priority of Chinese Patent Application No. 201711044294.8 filed on Oct. 31, 2017 in accordance with the Paris Treaty, the entire contents of which are hereby incorporated by reference.

TECHNICAL FIELD

The present disclosure belongs to the field of organic light emitting diode (OLED) display technology, and specifically, relates to an OLED device and a method for manufacturing the same, an OLED display substrate and an OLED display device.

BACKGROUND ART

An OLED display panel has the advantages of no backlight, low power consumption, fast response, long life and the like, and thus has been widely used. However, the OLED display panel has a strong reflection of ambient light, causing a decrease of the contrast of the OLED display when the ambient brightness is high and further influencing the display effect adversely.

SUMMARY

The present disclosure provides an OLED device, including a substrate, and a first electrode, a light emitting layer and a second electrode arranged on the substrate; and the light emitting layer includes fibers of p-phenylene based polymer as a host material, and the fibers of p-phenylene based polymer are arranged in a first orientation;

wherein the light emitted from the fibers of p-phenylene based polymer arranged in the first orientation is linearly polarized light in a first direction.

Optionally, the p-phenylene based polymer is any one or any combination of poly(p-phenylenebenzobisoxazole), poly(p-phenylenebenzobisimidazole) and poly(p-phenylenebenzobisthiazole).

Optionally, the p-phenylene based polymer has a molecular weight of 10,000 to 100,000 and a repeating unit formula weight of 150 to 300 g/mol.

Optionally, the light emitting layer further includes a guest material doped in the host material.

Optionally, the guest material is any one or any combination of pyrenes derivatives and anthracene derivatives.

Optionally, the guest material accounts for 1% to 10% by mass based on the light emitting layer.

Optionally, the light emitting layer has a thickness of 30 to 200 nm.

Optionally, the first direction is perpendicular to the first orientation.

The present disclosure also provides an OLED display panel, including:

a plurality of the above OLED devices.

The present disclosure also provides an OLED display device, including:

the above OLED display panel; and a linearly polarized anti-reflection film arranged on an out-light surface of the OLED display panel, wherein the linearly polarized anti-reflection film includes a linear polarizer having a light transmission direction parallel to the first direction.

The present disclosure also provides a method for manufacturing the above OLED device, including:

a step of forming the light emitting layer.

Optionally, the step of forming the light emitting layer includes:

forming a solution layer comprising oriented fibers of p-phenylene based polymer, wherein the solution layer of p-phenylene based polymer includes a solvent and the fibers p-phenylene based polymer dispersed in the solvent and arranged in a first orientation on the substrate; and removing the solvent and curing the fibers of p-phenylene based polymer to form the light emitting layer.

Optionally, forming a solution layer comprising oriented fibers of p-phenylene based polymer on the substrate includes:

dissolving fibers of p-phenylene based polymer into a solvent to form a solution of the fibers of p-phenylene based polymer; and coating the substrate with the solution of the fibers of p-phenylene based polymer in a unidirection along the first orientation with a scraper to form a solution layer comprising oriented fibers of p-phenylene based polymer.

Optionally, forming a solution layer comprising oriented fibers of p-phenylene based polymer on the substrate includes:

forming a layer of fibers of p-phenylene based polymer arranged in a first orientation on the substrate; and dripping a solvent onto the fibers of p-phenylene based polymer to disperse the fibers of p-phenylene based polymer so as to form a solution layer comprising oriented fibers of p-phenylene based polymer.

Optionally, the solvent includes polyphosphoric acid and/or methanesulfonic acid.

DETAILED DESCRIPTION OF THE EMBODIMENTS

In order that those skilled in the art better understand the technical solution of the present disclosure, the present disclosure will be further described in detail below in combination with the accompanying drawings and specific embodiments.

In order to avoid the problems in the conventional OLED display device, an anti-reflection film needs to be attached to the out-light surface of the OLED display panel in the existing OLED display device. The common anti-reflection film is a linearly polarized anti-reflection film, so that only the linearly polarized light in a specific direction among the ambient light irradiated onto the anti-reflection film can pass through, and the rest light is absorbed.

However, since the light emitted from the OLED display panel has no polarization performance, only linearly polarized light in a specific direction could pass through the linearly polarized anti-reflection film. Generally, at least 50% of the light is absorbed by the linearly polarized anti-reflection film, thereby greatly reducing the brightness and light transmittance of the OLED display panel.

The present disclosure provides an OLED device which is provided with an organic light emitting diode used for realizing the functions of light emission, display and the like.

The OLED device includes a substrate, and a first electrode, a light emitting layer and a second electrode arranged on the substrate; and the light emitting layer includes fibers of p-phenylene based polymer as a host material, and the fibers of p-phenylene based polymer are arranged in a first orientation;

wherein the light emitted by the fibers of p-phenylene based polymer arranged in the first orientation is linearly polarized light in a first direction.

The p-phenylene based polymer has a rigid, rod-like, fully conjugated molecular structure, and the polymer has good fluorescent electroluminescent properties or could emit light by being doped with a guest material. The light emitting layer of the OLED according to the present disclosure uses fibers of p-phenylene based polymer as a host material, and the fibers are arranged in a first orientation, namely that their length directions are parallel to the first orientation. Thus, the light emitted by the p-phenylene based polymer in the light emitting layer of the OLED according to the present disclosure is linearly polarized light in a first direction (having a specific relationship to the first orientation).

Figure 2:
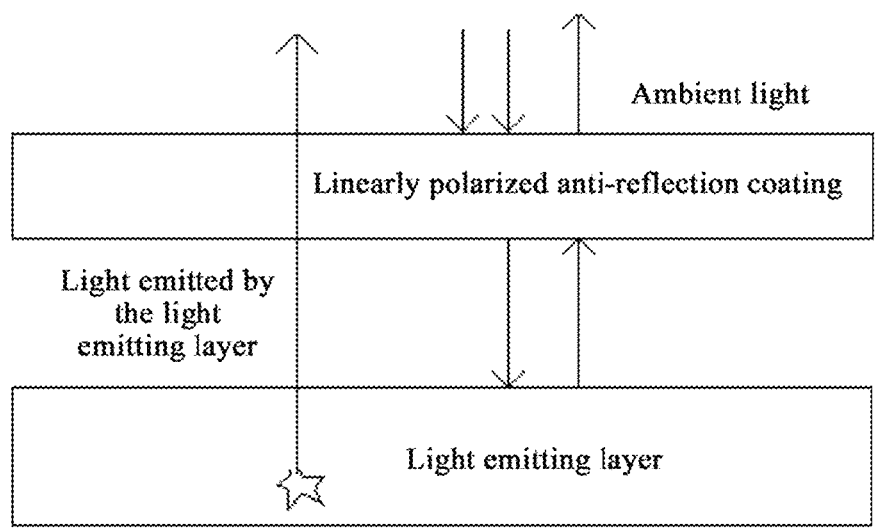
FIG. 2 is a principle diagram of an OLED display device according to the present disclosure.

As shown in FIG. 2, since the light emitted by the light emitting layer in the OLED device according to the present disclosure is linearly polarized light having a specific polarization direction as described above, the light emitted by the light emitting layer can be completely transmitted (100%) theoretically as long as the light transmission direction of a linearly polarized anti-reflection film (i.e., a linear polarizer therein) is set to be parallel to the polarization direction. Thus, the OLED device has very high brightness and light transmittance while achieving a high contrast by using a linearly polarized anti-reflection film.

Optionally, the first direction is perpendicular to the first orientation. Light emitting groups of the p-phenylene based polymer are usually located on the conjugate plane of the main chain of the molecular, in which case the polarization direction (first direction) of light emitted by the light emitting groups is just perpendicular to the arrangement direction (first orientation) of p-phenylene based polymer molecules (fibers).

Of course, the p-phenylene based polymer molecules may also include branches. If the light emitting groups are on the branches, the first direction may be at other angles with respect to the first orientation.

Figure 1:
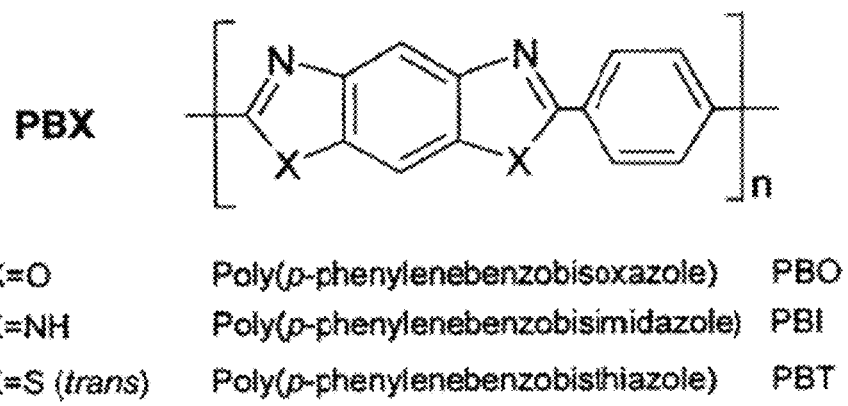
FIG. 1 is a general formula of a p-phenylene based polymer used in an OLED device according to the present disclosure.

Optionally, a general formula of the p-phenylene based polymer is as shown in FIG. 1, wherein X may be O, NH, S (trans) or other group. Specifically, according to the difference of X in the formula, the p-phenylene based polymer may be any one or any combination of poly(p-phenylenebenzobisoxazole) (PBO), poly(p-phenylenebenzobisimidazole) (PBI), poly(p-phenylenebenzobisthiazole) (PBT), etc.

Optionally, the p-phenylene based polymer has a molecular weight of 10,000 to 100,000 and a repeating unit formula weight of 150 to 300 g/mol.

Generally, the p-phenylene based polymer applicable to the light emitting layer may have a molecular weight and a repeating unit formula weight within the above range.

The p-phenylene based polymer can emit light alone, or being doped with a small molecular guest material to achieve better light emitting performance. The guest material may be selected from pyrenes derivatives, anthracenes derivatives or the like, such as Alq3, TPP, DSA-Ph, etc. Based on the total mass of the light emitting layer as 100%, the content of the guest material is usually 1% to 10%.

The light emitting layer using the fibers of p-phenylene based polymer as a host material may have a thickness of 30 nm to 200 nm.

The present disclosure also provides a method for manufacturing the above OLED device, including:

a step of forming a light emitting layer.

The process of manufacturing an OLED device often includes steps of forming other structures such as an anode, a hole auxiliary layer, an electron auxiliary layer, a cathode and the like. Since these steps are known to those skilled in the art, these steps would not be described in detail here. Only the step of forming the light emitting layer will be described in detail below.

Specifically, the step of forming the light emitting layer may include:

forming a solution layer comprising oriented fibers of p-phenylene based polymer on the substrate, wherein the solution layer comprising oriented fibers of p-phenylene based polymer includes a solvent, and fibers of p-phenylene based polymer dispersed in the solvent and arranged in a first orientation; and removing the solvent and curing the fibers of p-phenylene based polymer to form the light emitting layer.

A layer of solution comprising fibers of p-phenylene based polymer is formed on a substrate (specifically an anode, a hole auxiliary layer, etc.), wherein the solution is in a state of lyotropic liquid crystal (similar to a colloidal state) of oriented fibers of p-phenylene based polymer. In the lyotropic liquid crystal, the fibers of p-phenylene based polymer are dissolved in a solvent and arranged substantially in a first orientation. Thus, when the solvent is removed from the lyotropic liquid crystal, the fibers of p-phenylene based polymer are cured and maintained substantially in the first orientation, thereby forming the above-mentioned light emitting layer.

The solvent may be any solvent capable of causing the p-phenylene based polymer to form a lyotropic liquid crystal. Specifically, the solvent may be any one or any combination of polyphosphoric acid and methanesulfonic acid.

Accordingly, the solvent may be removed by multiple ways. For example, in a typical method, the solvent can be removed by heating and drying (for example, keeping the temperature at 100 to 200° C. for 60 to 120 minutes); or applying other agents that can absorb the solvent but cannot dissolve the fibers of p-phenylene based polymer to the solution layer, wherein the agents absorb the solvent in the lyotropic liquid crystal so that the fibers of p-phenylene based polymer are left to form the light emitting layer, and then the agents and solvent absorbed therein are removed to achieve the effect of removing the solvent as well.

If the guest material is further included in the light emitting layer, the guest material can also be dissolved in the above solution layer, so that the guest material remains in the light emitting layer after the solvent is removed.

Specifically, as an embodiment of the present disclosure, forming a solution layer comprising oriented fibers of p-phenylene based polymer on the substrate includes:

dissolving fibers of p-phenylene based polymer into a solvent to form a solution comprising the fibers of p-phenylene based polymer; and coating the substrate with the solution of the fibers of p-phenylene based polymer in a unidirection along the first orientation with a scraper to form a solution layer comprising oriented fibers of p-phenylene based polymer.

This method is also referred to as a "mechanical tailoring method", including the steps of dissolving fibers of p-phenylene based polymer into a solvent to form a lyotropic liquid crystal, which is neither oriented nor a "layer" on the substrate, but a liquid contained in a proper container; and then coating the substrate with the lyotropic liquid crystal in a unidirection (not back and forth) along the first orientation by using a scraper with a flat edge to form a lyotropic liquid crystal layer. Since the lyotropic liquid crystal layer is subject to a unidirectional stress in the scrape coating process, the molecular chains of the fibers of p-phenylene based polymer therein are spread by mechanical guide in a form of distribution substantially in the first orientation to obtain a solution layer comprising oriented fibers of p-phenylene based polymer.

As another embodiment of the present disclosure, forming a solution layer comprising oriented fibers of p-phenylene based polymer on the substrate includes:

forming a layer of fibers of p-phenylene based polymer arranged in a first orientation on the substrate; and dripping a solvent onto the fibers of p-phenylene based polymer to disperse the fibers of p-phenylene based polymer so as to form a solution layer comprising oriented fibers of p-phenylene based polymer.

This method is also referred to as a "fiber solving method", in which fibers of p-phenylene based polymer are formed firstly by a conventional chemical method such as spinning, and arranged on the substrate in a first orientation (the fibers of p-phenylene based polymer are independent from one another at this moment and do not form an integral "layer"). Then, a solvent is dripped onto the fibers of p-phenylene based polymer to dissolve them and a solution layer comprising oriented fibers of p-phenylene based polymer is obtained. Since the solvent are applied by dripping, the solvent on the substrate does not flow obviously and the dissolved fibers of p-phenylene based polymer are substantially maintained in the first orientation. Finally, by removing the solvent, the fibers of p-phenylene based polymer is cured again to form an integral light emitting layer.

Compared with a method of achieving orientated arrangement of fibers by substrate patterning in the prior art, the above two methods of forming an oriented light emitting layer (or oriented fibers) have low process requirements and are simple, and are easy to operate and low in cost.

Two OLED devices are manufactured according to the above two embodiments, wherein the light emitting layers are both made of poly(p-phenylenebenzobisoxazole) (PBO) fibers by the mechanical tailoring method and the fiber solving method respectively.

Figure 5:
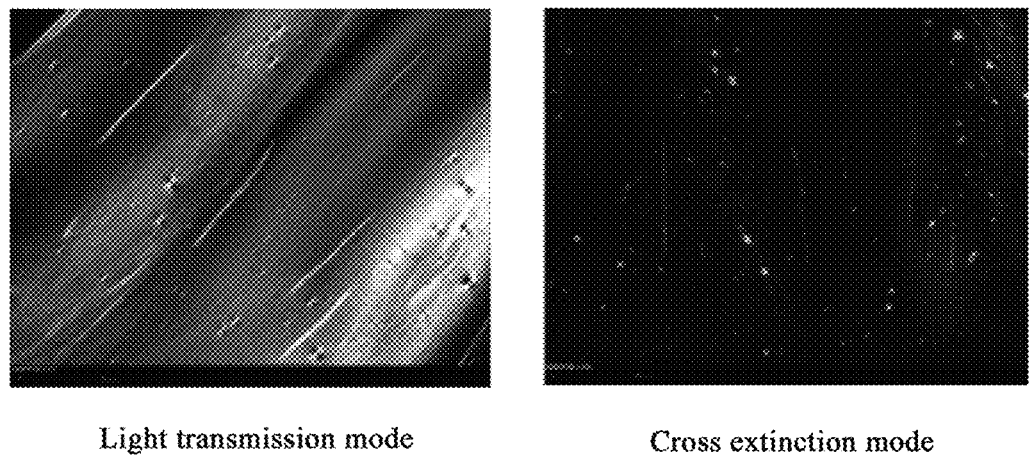
FIG. 5 is photomicrographs of light emitting layers in the OLED devices according to the present disclosure under light transmission mode and cross extinction mode.

Photomicrographs of the obtained light emitting layers are shown in FIG. 5. It can be seen that a clear bright field image can be seen in the light transmission mode, and the image is almost black in the cross extinction mode, which indicates that the fibers in the light emitting layer described above are distributed in a certain orientation and have obvious optical anisotropy.

Figure 6:
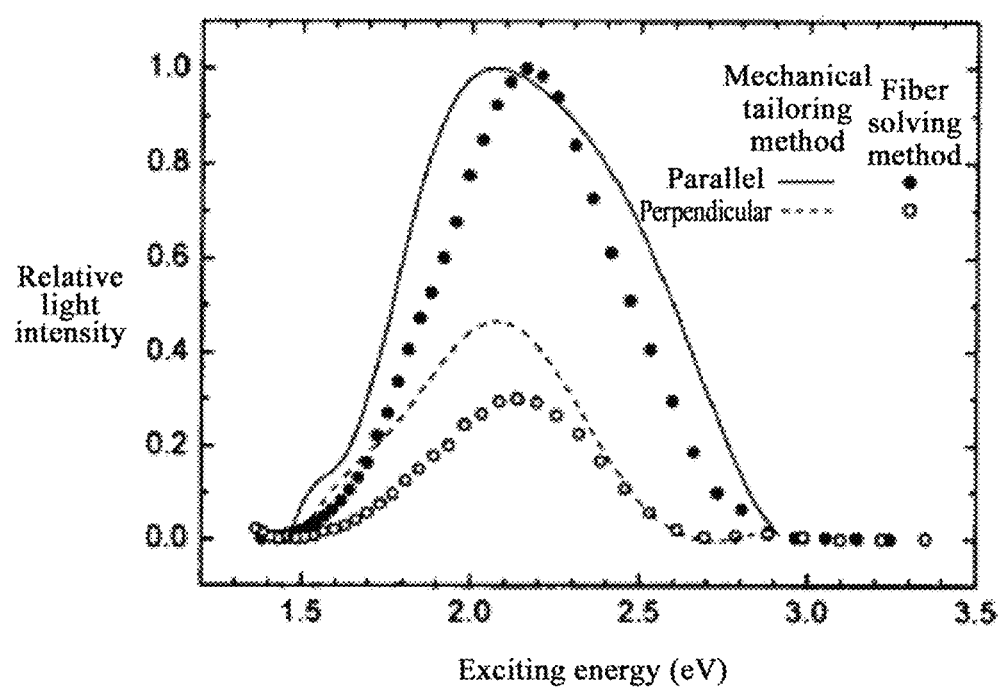
FIG. 6 is a diagram showing relationships between the brightness and excitation energy of the OLED device according to the present disclosure.

Then, a linear polarizer is arranged on the out-light side of the OLED device, and the intensity of light transmitting the linear polarizer is detected (the maximum light intensity detected is 1) under the conditions that the vibration transmission direction of the linear polarizer is parallel and perpendicular to the first direction. The results are shown in FIG. 6. It can be seen that in the two OLED devices, under each level of excitation energy, the light intensity detected when the vibration transmission direction of the linear polarizer is parallel to the first direction is much higher than that detected when they are perpendicular to each other. This indicates that the light emitting layer meeting the above requirement can be obtained by both of the above two methods. At the same time, it also indicates that linearly polarized light occupies a large ratio in the light emitted by the light emitting layer meeting the above requirement, and the polarization direction is concentrated, so the OLED device can achieve a higher contrast, brightness and light transmittance at the same time.

Figure 3:
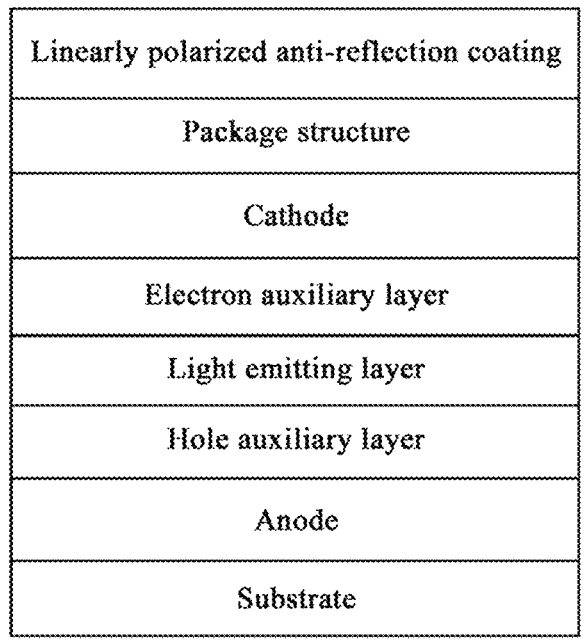
FIG. 3 is a structure diagram of an OLED display device according to the present disclosure.
Figure 4:
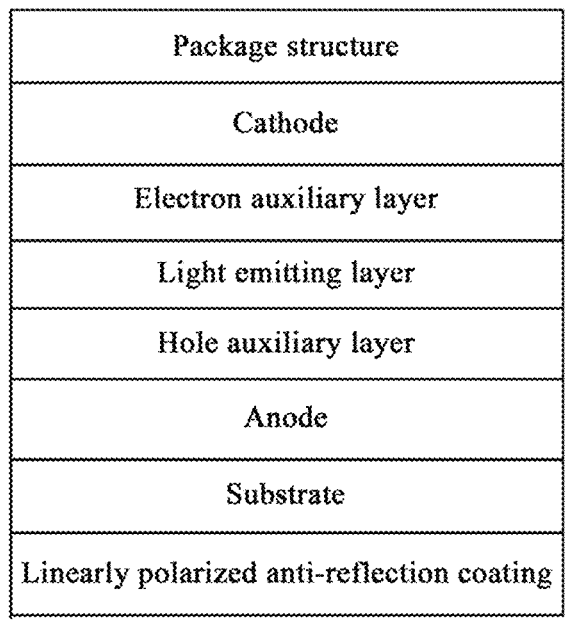
FIG. 4 is a structure diagram of another OLED display device according to the present disclosure.

Of course, as shown in FIGS. 3 and 4, the OLED device further includes many other structures, which are exemplified below (but the following is not a limitation of the scope of the present disclosure).

(1) a substrate, which can be made of rigid glass, or flexible polyimide (PI), a polymer film or the like, and generally should have a high transmittance.

(2) an anode (first electrode), which can be formed on the substrate by a deposition process such as sputtering and be made of a transparent metal oxide such as indium tin oxide (ITO), indium zinc oxide (IZO) or indium gallium zinc oxide (IGZO) with a thickness of 7 to 15 nm;

For an OLED device of a top emission type (i.e., the light does not exit through the substrate), a reflective structure is required between the light emitting layer and the substrate, and a high-reflection (e.g., reflectivity>80%) metal layer (which may also be considered as a part of the anode, that is, the anode is a high-reflection anode) can be provided between the indium tin oxide and the substrate, such as a silver layer having a thickness of 80 to 150 nm.

of course, for an OLED device of a bottom emission type (i.e., the light exits through the substrate), the reflective structure should be on a cathode side and no reflective structure is required at the anode. The transmission of the anode is generally required to be high (e.g., the total transmission of the anode and the substrate is more than 85%).

(3) a hole auxiliary layer, which can be formed on the anode by vacuum evaporation, spin coating, ink jet printing or the like to assist in the transport and injection of holes.

Specifically, the hole auxiliary layer may include one or more of a hole injection layer (HIL), a hole transport layer (HTL) and an electron blocking layer (EBL), and the materials suitable for the layers include copper phthalocyanine (CuPc), N,N'-diphenyl-N,N'-(1-naphthyl)-1,1'-biphenyl-4,4'-diamine (NPB), etc.

(4) the above-mentioned light emitting layer on the hole auxiliary layer, which will not be described in detail herein.

(5) an electron auxiliary layer, which can be formed on the light emitting layer by vacuum evaporation, spin coating, ink jet printing or the like to assist in the transport and injection of electrons.

Specifically, the electron auxiliary layer may include one or more of a hole blocking layer (HBL), an electron transport layer (ETL), an electron injection layer (EIL) and the like, and the materials suitable for the layers include tris(8-hydroxyquinoline) aluminum (AlQ3), 8-hydroxyquinoline lithium (LiQ), 4,7-diphenyl-1,10-phenanthroline (BPhen), 2,9-dimethyl-4,7-biphenyl-1,10-phenanthroline (BCP) and the like.

(6) a cathode, which can be formed on the electron auxiliary layer by vacuum evaporation or the like, and can be made of a metal such as aluminum, silver or magnesium.

For the above-mentioned top emission type OLED device, light is emitted through the cathode, so the cathode needs to be thin and transparent, e.g., having a thickness of 10 to 20 nm.

For the bottom emission type OLED device, a reflective structure should be provided on the cathode side. Since the cathode is generally made of a high-reflection metal, the thickness of the cathode can be increased (for example, to 80 to 150 nm), and the cathode is used as a reflective structure (i.e., a high-reflection cathode).

(7) a package structure, which is formed above the cathode, and functions to close the light emitting layer to avoid performance decline caused by contact between the light emitting layer and external water, oxygen and the like, so the package structure should have good impermeability. Generally, the water permeability of the package structure should be less than or equal to 10-5 g/(m$^2$·day) under the test in accordance with WVGR standards.

Specifically, the package structure may be a package layer attached to the cathode through a thin film encapsulation process, that is, it may be a part of an OLED device or an OLED display panel.

The present disclosure also provides an OLED display panel, including:

a plurality of the above OLED devices.

That is to say, more than one OLED device can be formed on the same substrate with each OLED device as a sub-pixel, thereby obtaining an OLED display panel that can be used for display.

The OLED display panel can also be classified into a top emission type and a bottom emission type according to the position of the reflective structure, which will not be described in detail herein.

In order to realize the function of display, the OLED display panel may further include other conventional structures such as gate lines, data wires, a pixel circuit, a color filter film and the like, which will not be described in detail herein.

The present disclosure also provides an OLED display device, including the above-mentioned OLED display panel; and a linearly polarized anti-reflection film arranged on an out-light surface of the OLED display panel, wherein the linearly polarized anti-reflection film includes a linear polarizer having a vibration transmission direction parallel to the first direction.

According to the difference in types of OLED display panels (a top emission type and a bottom emission type), the light outgoing surface of the OLED display panel is also different, so the position of the linearly polarized anti-reflection film is also different. For example, the linearly polarized anti-reflection film can be arranged on the surface of the package structure (e.g., a package layer or a cell aligned substrate) as shown in FIG. 3 (corresponding to the top emission mode), or arranged on the surface of the substrate away from an organic light emitting diode as shown in FIG. 4 (corresponding to the bottom emission mode).

The linearly polarized anti-reflection film described above includes a linear polarizer which only allows linearly polarized light in a specific polarization direction (parallel to the vibration transmission direction of the linear polarizer) to pass. In the OLED display device of the present disclosure, the polarization direction of the linearly polarized light emitted by the light emitting layer (i.e. the first direction) is parallel to the vibration transmission direction, so that the light emitted by the light emitting layer can completely (100%) pass through the polarizer in the linearly polarized anti-reflection film theoretically, while at least 50% of ambient light incident from the outside is absorbed by the polarizer (in combination with other structures in the linearly polarized anti-reflection film, the actual absorption rate of the ambient light can be more than 95%). Thus, the OLED display device has a good contrast by effectively eliminating external disturb, and also has high brightness and light transmittance.

Specifically, the display device can be any product or component having a display function, such as electronic paper, a mobile phone, a tablet computer, a television, a display, a notebook computer, a digital photo frame, a navigator, etc.

It could be understood that the above embodiments are merely exemplary embodiments for illustrating the principle of the present disclosure, but the present disclosure is not limited thereto. Various variations and improvements may be made for those of ordinary skill in the art without departing from the spirit and essence of the present disclosure, and these variations and improvements are also encompassed within the protection scope of the present disclosure.

The invention claimed is:

1. An organic light emitting diode device, comprising a substrate, and a first electrode, a light emitting layer and a second electrode arranged on the substrate,
   wherein the light emitting layer comprises fibers of p-phenylene based polymer as a host material, and the fibers of p-phenylene based polymer are arranged in a first orientation the light emitted by the fibers of p-phenylene based polymer arranged in the first orientation is linearly polarized light in a first direction,
   the p-phenylene based polymer has a molecular weight of 10,000 to 100,000 and a repeating unit formula weight of 150 to 300 g/mol,
   the first direction is perpendicular to the first direction, and
   wherein the light emitting layer further comprises a guest material doped in the host material.

2. The organic light emitting diode device according to claim 1, wherein
   the p-phenylene based polymer is any one or any combination of poly(p-phenylenebenzobisoxazole), poly(p-phenylenebenzobisimidazole) and poly(p-phenylenebenzobisthiazole).

3. The organic light emitting diode device according to claim 1, wherein the guest material is any one or any combination of pyrenes derivatives and anthracenes derivatives.

4. The organic light emitting diode device according to claim 1, wherein the guest material accounts for 1 to 10% by mass in the light emitting layer.

5. The organic light emitting diode device according to claim 1, wherein the light emitting layer has a thickness of 30 to 200 nm.

6. An organic light emitting diode display panel, comprising:

a plurality of organic light emitting diode devices according to claim 1.

7. An organic light emitting diode display device, comprising the organic light emitting diode display panel according to claim 6; and
    a linearly polarized anti-reflection film arranged on an out-light surface of the organic light emitting diode display panel, wherein the linearly polarized anti-reflection film comprises a linear polarizer having a vibration transmission direction parallel to the first direction.

8. A method for manufacturing an organic light emitting diode device according to claim 1, comprising:
    a step of forming the light emitting layer.

9. The method for manufacturing an organic light emitting diode device according to claim 8, wherein the step of forming the light emitting layer comprises:
    forming a solution layer comprising oriented fibers of p-phenylene based polymer on a substrate, wherein the solution layer comprises a solvent and fibers of p-phenylene based polymer dispersed in the solvent and arranged in a first orientation; and
    removing the solvent and curing the fibers of p-phenylene based polymer to form the light emitting layer.

10. The method for manufacturing an organic light emitting diode device according to claim 9, wherein forming a solution layer comprising oriented fibers of p-phenylene based polymer on a substrate comprises:
    dissolving fibers of p-phenylene based polymer into a solvent to form a solution comprising the fibers of p-phenylene based polymer; and
    coating the solution comprising the fibers of p-phenylene based polymer in a unidirection along the first orientation by a scraper on the substrate, to form a solution layer comprising oriented fibers of p-phenylene based polymer.

11. The method for manufacturing an organic light emitting diode device according to claim 9, wherein forming a solution layer comprising oriented fibers of p-phenylene based polymer on a substrate comprises:
    arranging fibers of p-phenylene based polymer in a first orientation on the substrate; and
    dripping a solvent onto the fibers of p-phenylene based polymer to dissolve the fibers of p-phenylene based polymer, so as to form a solution layer comprising oriented fibers of p-phenylene based polymer.

12. The method for manufacturing an organic light emitting diode device according to claim 9, wherein the solvent is any one or any combination of polyphosphoric acid and methanesulfonic acid.

\* \* \* \* \*